(12) United States Patent
Inoue et al.

(10) Patent No.: US 12,150,215 B2
(45) Date of Patent: Nov. 19, 2024

(54) WAFER PLACEMENT TABLE

(71) Applicant: NGK INSULATORS, LTD., Nagoya (JP)

(72) Inventors: Seiya Inoue, Handa (JP); Reo Watanabe, Handa (JP); Yuma Iwata, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 340 days.

(21) Appl. No.: 17/305,173

(22) Filed: Jul. 1, 2021

(65) Prior Publication Data
US 2022/0124874 A1    Apr. 21, 2022

(30) Foreign Application Priority Data
Oct. 16, 2020    (JP) .................................. 2020-174775

(51) Int. Cl.
*H05B 1/02*        (2006.01)
*H01L 21/687*      (2006.01)
(Continued)

(52) U.S. Cl.
CPC ..... *H05B 1/0233* (2013.01); *H01L 21/68757* (2013.01); *H05B 3/03* (2013.01); *H05B 3/143* (2013.01); *H05B 3/26* (2013.01)

(58) Field of Classification Search
CPC ........ H05B 1/0233; H05B 3/03; H05B 3/143; H05B 3/26; H01L 21/68757
See application file for complete search history.

(56) References Cited

U.S. PATENT DOCUMENTS

2003/0075537 A1    4/2003    Okajima et al.
2014/0087587 A1    3/2014    Lind
(Continued)

FOREIGN PATENT DOCUMENTS

CN    110383432 A        10/2019
JP    2001210705 A    *   8/2001
(Continued)

OTHER PUBLICATIONS

Japanese Office Action (Application No. 2020-174775) dated Jun. 27, 2023 (with English translation) (7 pages).
(Continued)

*Primary Examiner* — Janie M Loeppke
*Assistant Examiner* — Theodore J Evangelista
(74) *Attorney, Agent, or Firm* — BURR PATENT LAW, PLLC

(57)    ABSTRACT

A wafer placement table includes a ceramic plate, an electrode embedded in the ceramic plate, a hollow ceramic shaft attached to a surface of the ceramic plate, a power-supplying member running inside the ceramic shaft and connected to a terminal of the electrode, a plate-side attaching site defined on the ceramic plate and to which the power-supplying member is attached, a power-source-side attaching site defined at a free end of the ceramic shaft and to which the power-supplying member is attached, and a redirecting member provided inside the ceramic shaft. The power-source-side attaching site is defined in correspondence with the plate-side attaching site and in such a manner as to be shifted from the plate-side attaching site in plan view. The redirecting member holds the power-supplying member such that the power-supplying member extending from the power-source-side attaching site is forcibly redirected toward the plate-side attaching site.

11 Claims, 9 Drawing Sheets

(51) Int. Cl.
      *H05B 3/03*     (2006.01)
      *H05B 3/14*     (2006.01)
      *H05B 3/26*     (2006.01)

(56) References Cited

U.S. PATENT DOCUMENTS

2019/0131163 A1*   5/2019   Kuno ................. H01L 21/67109
2019/0385827 A1*  12/2019   Takahara .......... H01L 21/67103

FOREIGN PATENT DOCUMENTS

| | | | |
|---|---|---|---|
| JP | 2003-133195 A1 | | 5/2003 |
| JP | 2009182139 A | * | 8/2009 |
| KR | 10-2014-0038910 A | | 3/2014 |
| KR | 10-2019-0103403 A | | 9/2019 |

OTHER PUBLICATIONS

Korean Office Action (Application No. 10-2021-0124797) dated Jun. 28, 2023 (with English translation) (11 pages).
Chinese Office Action (with English translation) dated Aug. 7, 2024 (Application No. 202111198426.9).

* cited by examiner

WAFER PLACEMENT TABLE

BACKGROUND OF THE INVENTION

1. Field of the Invention

The present invention relates to a wafer placement table.

2. Description of the Related Art

Semiconductor manufacturing apparatuses employ ceramic heaters for heating wafers. One of such known ceramic heaters that is disclosed by PTL 1 includes a ceramic shaft joined to the back surface of a ceramic plate in which an inner-peripheral-side resistance heating element and an outer-peripheral-side resistance heating element are embedded. In this ceramic heater, the resistance heating elements are controllable for heat generation independently of each other by applying respective voltages thereto through respective power-supplying members.

CITATION LIST

Patent Literature

[PTL 1] JP 2003-133195 A

SUMMARY OF THE INVENTION

Some of such ceramic heaters are configured as follows. An installation table on which the ceramic heater is installed has sites to which the power-supplying members are attached. The sites are arranged closer to one another than sites of the ceramic plate to which the power-supplying members are respectively attached. In such a case, the power-supplying members are bent inside the ceramic shaft. Therefore, a load (moment) is applied to a joint between a tablet, which is embedded in the ceramic heater, and each of the power-supplying members, leading to possible breakage of the joint. Such a problem may occur if the sites to which the power-supplying members are attached are shifted from the respective attaching sites defined on the ceramic shaft in plan view. There are some other cases where cables are employed as the power-supplying members. Cables are bendable but have relatively high rigidity. Therefore, the load applied to the joint cannot be reduced satisfactorily. Hence, the above problem cannot be solved satisfactorily.

The present invention is to solve the above problem and chiefly aims to provide a wafer placement table in which the disconnection of power-supplying members from terminals provided at plate-side attaching sites is prevented.

A wafer placement table according to the present invention includes:
 a ceramic plate having a wafer placement surface;
 an electrode embedded in the ceramic plate;
 a hollow ceramic shaft attached to a surface of the ceramic plate, the surface being opposite the wafer placement surface;
 a power-supplying member running inside the ceramic shaft and connected to a terminal of the electrode, the power-supplying member conveying power from a power source to the electrode;
 a plate-side attaching site defined on the ceramic plate and to which the power-supplying member is attached, the plate-side attaching site being defined in an area enclosed by the ceramic shaft and in correspondence with the terminal of the electrode;
 a power-source-side attaching site defined at a free end of the ceramic shaft and to which the power-supplying member is attached, the power-source-side attaching site being defined in correspondence with the plate-side attaching site and in such a manner as to be shifted from the plate-side attaching site in plan view; and
 a redirecting member provided inside the ceramic shaft and that holds the power-supplying member such that the power-supplying member extending from the power-source-side attaching site is forcibly redirected toward the plate-side attaching site.

In the above wafer placement table, the plate-side attaching site and the power-source-side attaching site defined in correspondence with each other are shifted from each other in plan view. Furthermore, the redirecting member is provided inside the ceramic shaft. The redirecting member holds the power-supplying member such that the power-supplying member extending from the power-source-side attaching site is forcibly redirected toward the plate-side attaching site. The redirecting member reduces a load (moment) applied to the power-supplying member and acting to disconnect the power-supplying member from the terminal provided at the plate-side attaching site. Therefore, the disconnection of the power-supplying member from the terminal can be prevented. The power-source-side attaching site only needs to be defined on a side of the ceramic shaft that is near the free end. For example, the power-source-side attaching site may be a hole provided in a member attached to the free end of the ceramic shaft. If such a member is not provided, the power-source-side attaching site may be defined in a space near the free end of the ceramic shaft.

The wafer placement table according to the present invention may be configured as follows: the electrode is one of a plurality of electrodes including a heater electrode, the power-supplying member is one of a plurality of power-supplying members respectively connected to the terminals of the plurality of electrodes, the plate-side attaching site is one of a plurality of plate-side attaching sites defined in the area and in correspondence with the terminals of the plurality of electrodes, the power-source side attaching site is one of a plurality of power-source side attaching sites defined in correspondence with the plurality of plate-side attaching sites, with at least one of the plurality of power-source side attaching sites being shifted from a corresponding one of the plate-side attaching sites in plan view, and one of the plurality of power-supplying members that extends between the power-source-side attaching site and the plate-side attaching site that are shifted from each other is forcibly redirected by the redirecting member from a position coinciding with the power-source-side attaching site to a position coinciding with the plate-side attaching site. In such a configuration, the power-supplying member extending between the power-source-side attaching site and the plate-side attaching site that are shifted from each other in plan view can be prevented from being disconnected from a corresponding one of the terminals.

In the above configuration, the plurality of power-source-side attaching sites may all be shifted from the respective plate-side attaching sites in plan view. In such a configuration, all of the power-supplying members can be held in such a manner as to be forcibly redirected by the redirecting member. Furthermore, the power-supplying members may each include a flange near the ceramic plate. The flange of the power-supplying member is used in pushing the power-supplying member toward the plate-side attaching site when, for example, the power-supplying member is pressure-bonded or thermally pressure-bonded to the plate-side attaching site. The flange has a diameter greater than the diameter of the power-supplying member. The flanges of adjacent ones of the power-supplying members need to be insulated from each other. Furthermore, the occurrence of creeping discharge between adjacent ones of the plate-side attaching sites needs to be prevented. Therefore, if the power-supplying members including the flanges are employed, the plate-side attaching sites need to be arranged farther from one another than the power-source-side attaching sites (in other words, the power-source-side attaching sites need to be arranged closer to one another than the plate-side attaching sites). Consequently, each of the plate-side attaching sites and a corresponding one of the power-source-side attaching sites tend to be shifted from each other in plan view. Such a configuration is suitable for the application of the present invention.

In the wafer placement table according to the present invention, the redirecting member may have a plate-side hole portion located near the ceramic plate and extending from a position coinciding with the plate-side attaching site and parallel to an axial direction of the ceramic shaft; and an oblique hole portion extending obliquely from the plate-side hole portion to a position coinciding with the power-source-side attaching site. In such a configuration, the redirecting member can firmly hold the power-supplying member such that the power-supplying member extending from the power-source-side attaching site is forcibly redirected toward the plate-side attaching site. In such a case, the redirecting member may have a power-source-side hole portion located near the power source and extending from a position coinciding with the power-source-side attaching site and parallel to the axial direction of the ceramic shaft. Furthermore, the oblique hole portion may extend between the plate-side hole portion and the power-source-side hole portion and obliquely connect the plate-side hole portion and the power-source-side hole portion. The redirecting member having the three hole portions may include two components separated by a plane extending parallel to the wafer placement surface and across the oblique hole portion. The redirecting member having such a configuration is relatively easy to manufacture. The term "parallel" used herein includes a situation where complete parallelism is established, and a situation where substantially complete parallelism is established (including, for example, a situation where the parallelism established is within a tolerable range), which also applies to the following description.

In the wafer placement table according to the present invention, the redirecting member may have a plate-side hole portion located near the ceramic plate and extending from a position coinciding with the plate-side attaching site and parallel to an axial direction of the ceramic shaft; a power-source-side hole portion located near the power source and extending from a position coinciding with the power-source-side attaching site and parallel to the axial direction of the ceramic shaft; and a space defined between the plate-side hole portion and the power-source-side hole portion. In such a configuration as well, the redirecting member can firmly hold the power-supplying member such that the power-supplying member extending from the power-source-side attaching site is forcibly redirected toward the plate-side attaching site. In such a case, the redirecting member may include a first component having the plate-side hole portion, a second component having the power-source-side hole portion, and a third component defining the space. The redirecting member having such a configuration is relatively easy to manufacture.

In the wafer placement table according to the present invention, the power-supplying member may be soldered to the terminal of the electrode. Such a soldered joint is more likely to be broken at the application of a load to the power-supplying member than a mechanical joint using screws or the like, and is therefore suitable for the application of the present invention.

DETAILED DESCRIPTION OF THE INVENTION

Figure 1:
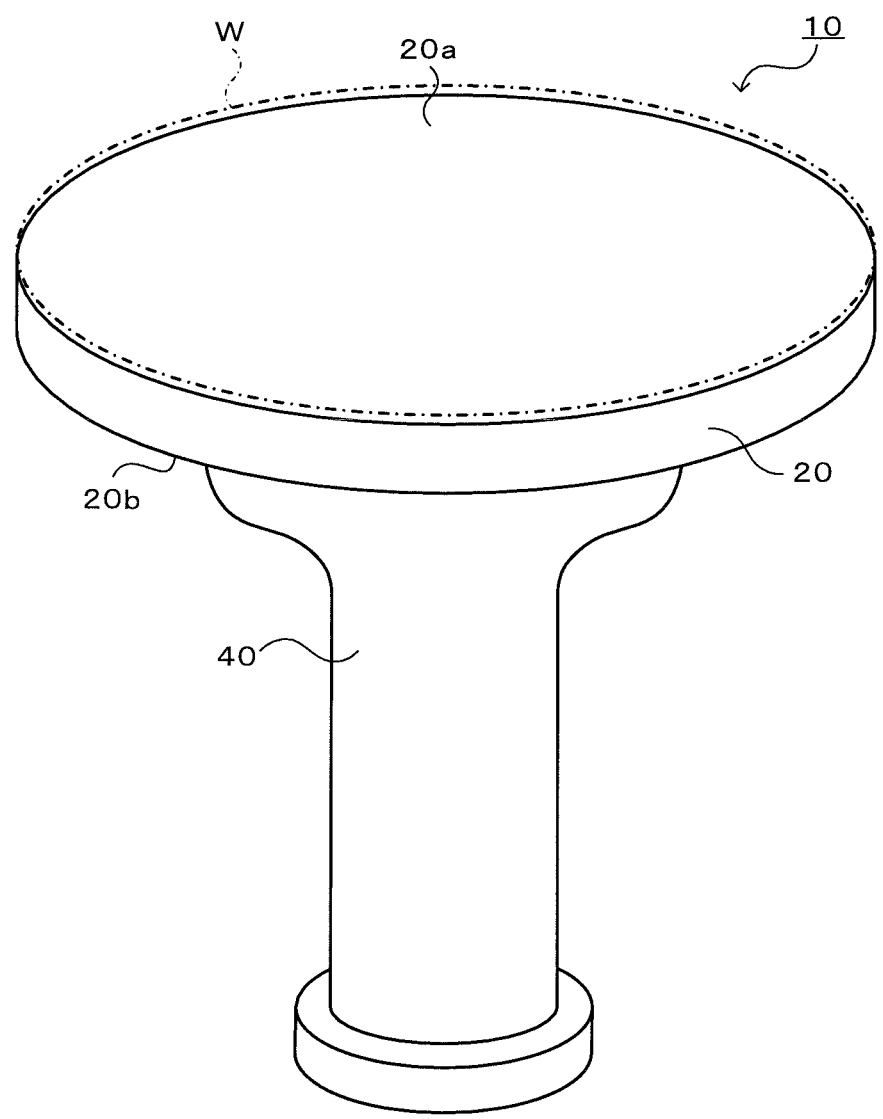
FIG. 1 is a perspective view of a ceramic heater 10.
Figure 2:
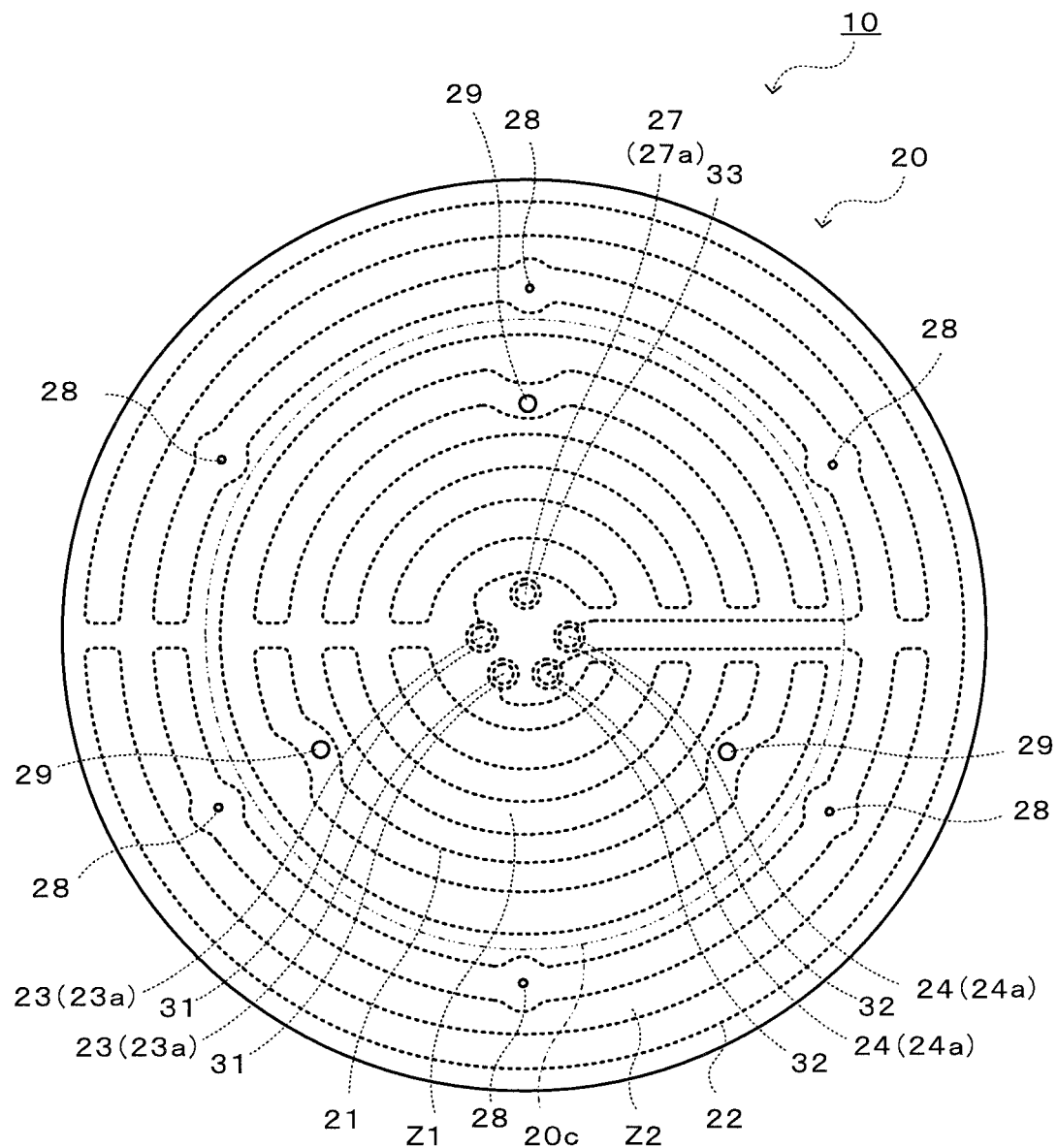
FIG. 2 is a plan view of a ceramic plate 20.
Figure 3:
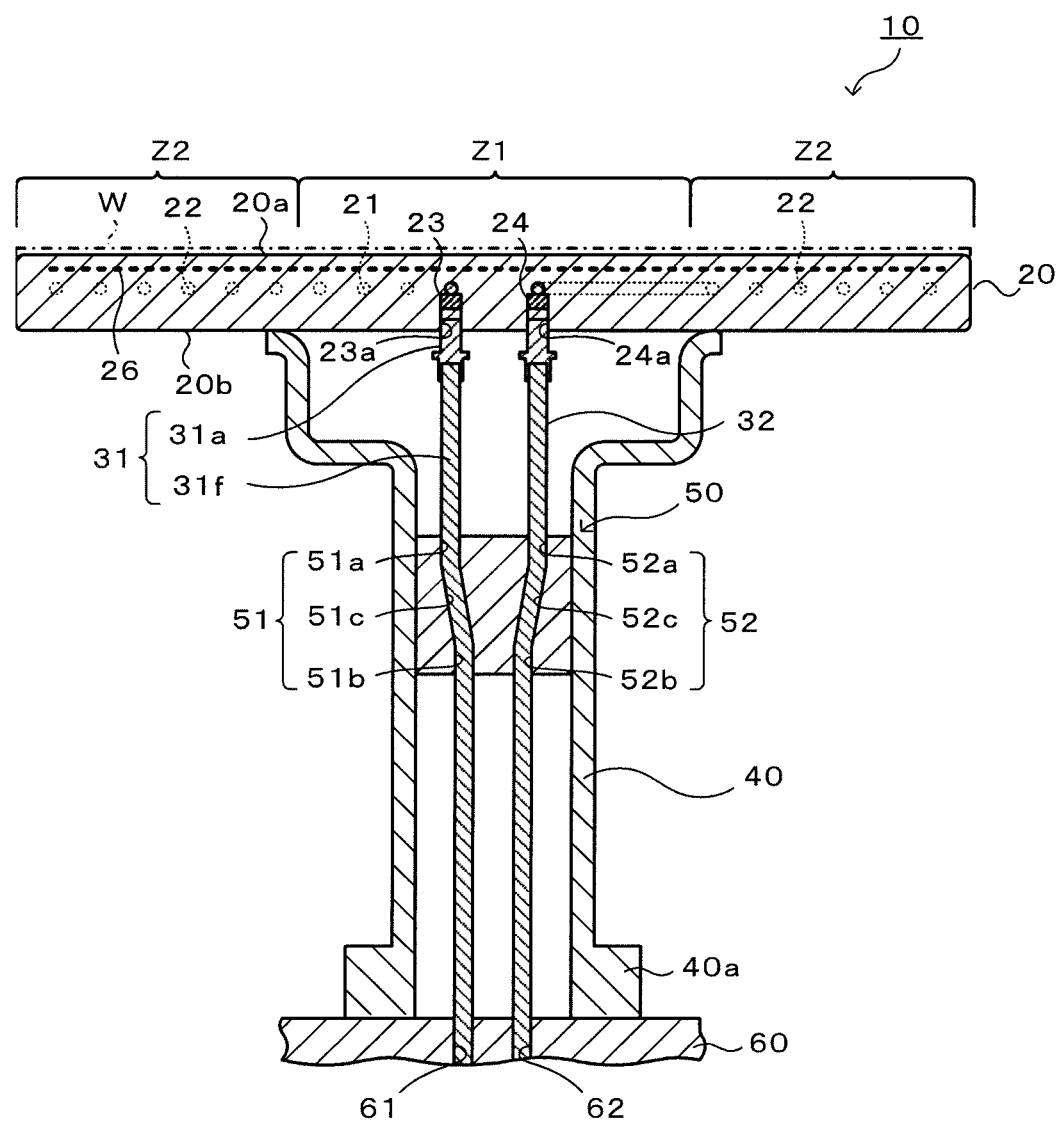
FIG. 3 is a longitudinal sectional view of the ceramic heater 10.
Figure 4:
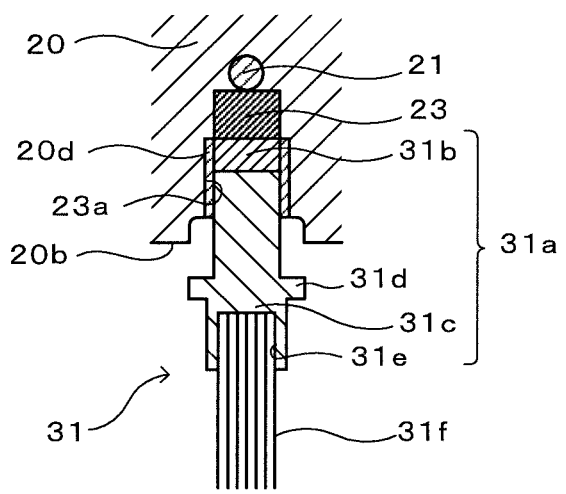
FIG. 4 is an enlargement of a part of FIG. 3.
Figure 5:
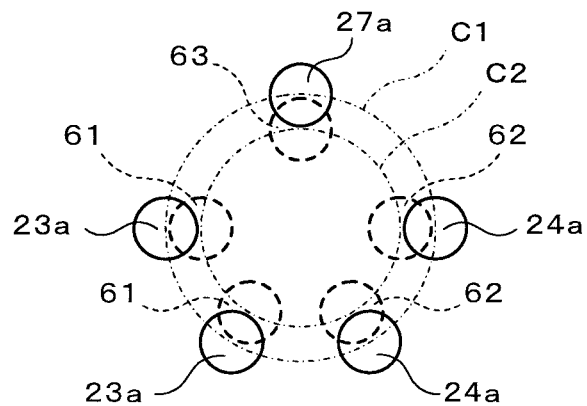
FIG. 5 is a schematic diagram illustrating a positional relationship between terminal holes 23a, 24a, and 27a and fitting holes 61 to 63 in plan view.
Figure 6:
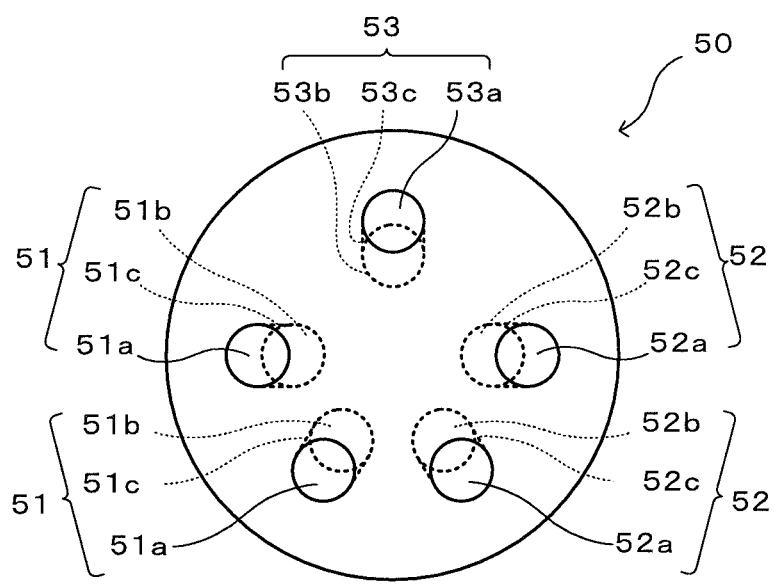
FIG. 6 is a plan view of a redirecting member 50.

Preferred embodiments of the present invention will now be described with reference to the drawings. FIG. 1 is a perspective view of a ceramic heater 10. FIG. 2 is a plan view of a ceramic plate 20. FIG. 3 is a longitudinal sectional view of the ceramic heater 10 (a sectional view of the ceramic heater 10 taken along a plane containing the center axis thereof). FIG. 4 is an enlargement of a part of FIG. 3 (an illustration of the distal end of a first power-supplying member 31 and elements therearound). FIG. 5 is a schematic diagram illustrating a positional relationship between terminal holes 23a, 24a, and 27a and fitting holes 61 to 63 in plan view. FIG. 6 is a plan view of a redirecting member 50. Illustration of elements, namely an RF electrode 26; a ceramic shaft 40; and so forth, by hidden lines is omitted in FIG. 2.

The ceramic heater 10 is an example of the wafer placement table according to the present invention. The ceramic heater 10 is used for heating a wafer W to be subjected to treatment such as etching or CVD and is installed in a vacuum chamber (not illustrated). The ceramic heater 10 includes the ceramic plate 20 and the ceramic shaft 40. The ceramic plate 20 has a disc shape with a wafer placement surface 20a. The ceramic shaft 40 has a cylindrical shape and is joined to a surface (back surface) 20b of the ceramic plate 20 that is opposite the wafer placement surface 20a. The ceramic shaft 40 is concentric with the ceramic plate 20.

The ceramic plate 20 is a disc-shaped plate made of a ceramic material such as aluminum nitride or alumina. The ceramic plate 20 has a diameter of, for example, about 300 mm. The wafer placement surface 20a of the ceramic plate 20 is embossed to have fine irregularities (not illustrated). The ceramic plate 20 is sectioned by a virtual boundary 20c (see FIG. 2), which is a circle concentric with the ceramic plate 20, into a small-circular first zone Z1 on the inner peripheral side and an annular second zone Z2 on the outer peripheral side. The virtual boundary 20c has a diameter of, for example, about 200 mm. The ceramic plate 20 has a first heater electrode 21 embedded in the first zone Z1, and a second heater electrode 22 embedded in the second zone Z2. The heater electrodes 21 and 22 are positioned in a common plane parallel to the wafer placement surface 20a. The ceramic plate 20 further has the RF electrode 26 (see FIG. 3) embedded therein.

As illustrated in FIG. 2, the ceramic plate 20 has a plurality of gas holes 28. The gas holes 28 extend through the ceramic plate 20 from the back surface 20b to the wafer placement surface 20a and allow gas to be supplied into gaps between the wafer W to be placed on the wafer placement surface 20a and the irregularities provided in the wafer placement surface 20a. The gas supplied into the gaps contributes to good heat conduction between the wafer placement surface 20a and the wafer W. The ceramic plate 20 further has a plurality of lift-pin holes 29. The lift-pin holes 29 extend through the ceramic plate 20 from the back surface 20b to the wafer placement surface 20a and receive lift pins (not illustrated) to be respectively inserted thereinto. The lift pins lift the wafer W placed on the wafer placement surface 20a. In the present embodiment, three lift-pin holes 29 are provided at regular intervals on the circumference of a common circle.

As illustrated in FIG. 2, the first heater electrode 21 is a resistance heating element that forms a one-stroke pattern extending from one of a pair of first terminals 23 that are provided in a central part of the ceramic plate 20 (within an area of the back surface 20b of the ceramic plate 20 that is enclosed by the ceramic shaft 40). The pattern makes a plurality of turns in such a manner as to spread over substantially the entirety of the first zone Z1 and eventually reach the other of the pair of first terminals 23. The resistance heating element forming the first heater electrode 21 forms the pattern while avoiding the lift-pin holes 29. The resistance heating element is chiefly made of high-melting-point metal or a carbide thereof. Examples of high-melting-point metal include tungsten, molybdenum, tantalum, platinum, rhenium, hafnium, and alloys of any of the foregoing materials. Examples of the carbide of high-melting-point metal include tungsten carbide, molybdenum carbide, and so forth. The first terminals 23 are exposed at the bottoms of respective first terminal holes 23a provided in the back surface 20b of the ceramic plate 20. The first terminals 23 are made of the same material as the resistance heating element. The distal ends of first power-supplying members 31 are respectively fitted into the first terminal holes 23a and are respectively soldered to the first terminals 23.

As illustrated in FIG. 2, the second heater electrode 22 is a resistance heating element that forms a one-stroke pattern extending from one of a pair of second terminals 24 that are provided in the central part of the ceramic plate 20. The pattern makes a plurality of turns in such a manner as to spread over substantially the entirety of the second zone Z2 and eventually reach the other of the pair of second terminals 24. The resistance heating element forming the second heater electrode 22 forms the pattern while avoiding the gas holes 28. The resistance heating element is chiefly made of high-melting-point metal or a carbide thereof. A part of the resistance heating element that extends between each of the second terminals 24 and the second zone Z2 is formed of a wire made of high-melting-point metal or a carbide thereof. The second terminals 24 are exposed at the bottoms of respective second terminal holes 24a provided in the back surface 20b of the ceramic plate 20. The second terminals 24 are made of the same material as the resistance heating element. The distal ends of second power-supplying members 32 are respectively fitted into the second terminal holes 24a and are respectively soldered to the second terminals 24.

The RF electrode 26 is a disc-shaped thin-film electrode having a slightly smaller diameter than the ceramic plate 20 and is made of thin metal wires woven into a mesh sheet. As illustrated in FIG. 3, the RF electrode 26 is embedded in the ceramic plate 20 between the wafer placement surface 20a and the first and second heater electrodes 21 and 22. The RF electrode 26 extends substantially parallel to the wafer placement surface 20a. The RF electrode 26 is chiefly made of high-melting-point metal or a carbide thereof. An RF terminal 27 of the RF electrode 26 is exposed at the bottom of an RF terminal hole 27a provided in the back surface 20b of the ceramic plate 20. The RF terminal 27 is made of the same material as the RF electrode 26. The distal end of an RF power-supplying member 33 is fitted into the RF terminal hole 27a and is soldered to the RF terminal 27.

As with the ceramic plate 20, the ceramic shaft 40 is made of ceramic such as aluminum nitride or alumina. The ceramic shaft 40 has an inside diameter of, for example, about 40 mm and an outside diameter of, for example, about 60 mm. The upper end of the ceramic shaft 40 is joined to the ceramic plate 20. The ceramic shaft 40 houses the first power-supplying members 31 respectively connected to the pair of first terminals 23 of the first heater electrode 21, the second power-supplying members 32 respectively connected to the pair of second terminals 24 of the second heater electrode 22, and the RF power-supplying member 33 connected to the RF terminal 27. The first power-supplying members 31 are connected to a first power source (not illustrated). The second power-supplying members 32 are connected to a second power source (not illustrated). The RF power-supplying member 33 is connected to an RF power source (not illustrated). Therefore, the temperature of the first zone Z1 to be heated by the first heater electrode 21 and the temperature of the second zone Z2 to be heated by the second heater electrode 22 are individually controllable. The power sources are provided outside an installation table 60.

The first power-supplying members 31, the second power-supplying members 32, and the RF power-supplying member 33 all have the same configuration. Therefore, the first power-supplying members 31 will be described herein as a representative example. As illustrated in FIG. 4, the first power-supplying members 31 each include a metal component 31a and a cable 31f. The first terminal holes 23a provided in the back surface 20b of the ceramic plate 20 each receive a cylindrical member 20d to be fitted therein. The cylindrical member 20d is made of metal (Ni, for example). The distal end of the metal component 31a is fitted into the cylindrical member 20d and is soldered to the first terminal 23. The metal component 31a is a highly rigid, unbendable component and includes a buffer member 31b and an oxidation-resistant conductive member 31c. The buffer member 31b is provided on the distal side of the metal component 31a. The buffer member 31b is used for reducing the difference in thermal expansion between the first terminal 23 and the oxidation-resistant conductive member 31c. Examples of the material for the buffer member 31b include Kovar. The oxidation-resistant conductive member 31c includes a flange 31d and has an insertion hole 31e. The flange 31d is used in soldering the first power-supplying member 31 to the first terminal 23. The insertion hole 31e receives the cable 31f that is insertable thereinto. Examples of the material for the oxidation-resistant conductive member 31c include nickel. The cable 31f is, for example, a rigid but bendable conductive cable formed of thin nickel wires that are twisted together. The distal end of the cable 31f is inserted into the insertion hole 31e and is joined to the metal component 31a. To join the first power-supplying member 31 to the first terminal 23, the distal end face of the metal component 31a and the first terminal 23 are thermally pressure-bonded to each other with solder interposed in between. The pressure is applied by pushing the flange 31d of the metal component 31a toward the first terminal 23 with a jig. To keep the adjacent first power-supplying members 31 insulated from each other, the respective flanges 31d need to be kept insulated from each other. Furthermore, the occurrence of creeping discharge between the first terminal holes 23a needs to be prevented. Therefore, a relatively long distance needs to be provided between the first terminal holes 23a. This also applies to the case of the adjacent second terminal holes 24a, the case of one of the first terminal holes 23a and one of the second terminal holes 24a that is adjacent thereto, the case of the RF terminal hole 27a and the other first terminal hole 23a adjacent thereto, and the case of the RF terminal hole 27a and the other second terminal hole 24a adjacent thereto. As illustrated in FIG. 5, the centers of the two first terminal holes 23a, the centers of the two second terminal holes 24a, and the center of the one RF terminal hole 27a are positioned on a circumference C1 of a circle having a diameter D1.

As illustrated in FIG. 3, the ceramic shaft 40 is fixed to the installation table 60. Specifically, a flange portion 40a provided at a free end (the lower end) of the ceramic shaft 40 is mechanically fixed to the installation table 60 with screws or the like. An area of the upper surface of the installation table 60 that is enclosed by the ceramic shaft 40 is provided with first fitting holes 61 into which the first power-supplying members 31 are fitted, second fitting holes 62 into which the second power-supplying members 32 are fitted, and an RF fitting hole 63 (see FIG. 5) into which the RF power-supplying member 33 is fitted. As illustrated in FIG. 5, the centers of the two first fitting holes 61, the centers of the two second fitting holes 62, and the center of the one RF fitting hole 63 are positioned on a circumference C2 of a circle having a diameter D2 (<D1). The first fitting holes 61, the second fitting holes 62, and the RF fitting hole 63 are arranged closer to one another than the first terminal holes 23a, the second terminal holes 24a, and the RF terminal hole 27a. Specifically, the distance between the adjacent first fitting holes 61 is shorter than the distance between the adjacent first terminal holes 23a, the distance between the adjacent second fitting holes 62 is shorter than the distance between the adjacent second terminal holes 24a, and the distance between one of the first fitting holes 61 and one of the second fitting holes 62 that is adjacent thereto is shorter than the distance between one of the first terminal holes 23a and one of the second terminal holes 24a that is adjacent thereto. Furthermore, the distance between the RF fitting hole 63 and the other first fitting hole 61 adjacent thereto is shorter than the distance between the RF terminal hole 27a and the other first terminal hole 23a adjacent thereto, and the distance between the RF fitting hole 63 and the other second fitting hole 62 adjacent thereto is shorter than the distance between the RF terminal hole 27a and the other second terminal hole 24a adjacent thereto.

The redirecting member 50 is a columnar member made of ceramic and is fixed inside the ceramic shaft 40. As illustrated in FIG. 6, the redirecting member 50 has first redirecting holes 51, second redirecting holes 52, and an RF redirecting hole 53. As illustrated in FIG. 3, the first redirecting holes 51 each forcibly redirect a corresponding one of the first power-supplying members 31 from a position coinciding with a corresponding one of the first fitting holes 61 provided in the installation table 60 (a position defined on the lower surface of the redirecting member 50 by a line parallel to the axial direction of the ceramic shaft 40 and passing through the center of the first fitting hole 61) to a position coinciding with a corresponding one of the first terminal holes 23a provided in the ceramic plate 20 (a position defined on the upper surface of the redirecting member 50 by a line parallel to the axial direction of the ceramic shaft 40 and passing through the center of the first terminal hole 23a). The second redirecting holes 52 each forcibly redirect a corresponding one of the second power-supplying members 32 from a position coinciding with a corresponding one of the second fitting holes 62 provided in the installation table 60 to a position coinciding with a corresponding one of the second terminal holes 24a provided in the ceramic plate 20. The RF redirecting hole 53 (not illustrated in FIG. 3) forcibly redirects the RF power-supplying member 33 from a position coinciding with the RF fitting hole 63 provided in the installation table 60 to a position coinciding with the RF terminal hole 27a provided in the ceramic plate 20.

The first redirecting hole 51 includes a plate-side hole portion 51a, a power-source-side hole portion 51b, and an oblique hole portion 51c. The plate-side hole portion 51a is a portion of the first redirecting hole 51 that is located near the ceramic plate 20. The plate-side hole portion 51a extends from the position defined on the upper surface of the redirecting member 50 and coinciding with the first terminal hole 23a to a predetermined depth and parallel to the axial direction of the ceramic shaft 40. The power-source-side hole portion 51b is a portion of the first redirecting hole 51 that is located near the power source (near the installation table 60). The power-source-side hole portion 51b extends from the position defined on the lower surface of the redirecting member 50 and coinciding with the first fitting hole 61 to a predetermined depth and parallel to the axial direction of the ceramic shaft 40. The depth of the plate-side hole portion 51a and the depth of the power-source-side hole portion 51b may be the same or different. The oblique hole portion 51c extends between the bottom of the plate-side hole portion 51a and the bottom of the power-source-side hole portion 51b and obliquely connects the plate-side hole portion 51a and the power-source-side hole portion 51b to each other.

The second redirecting hole 52 includes a plate-side hole portion 52a, a power-source-side hole portion 52b, and an oblique hole portion 52c. The plate-side hole portion 52a is a portion of the second redirecting hole 52 that is located near the ceramic plate 20. The plate-side hole portion 52a extends from the position defined on the upper surface of the redirecting member 50 and coinciding with the second terminal hole 24a to a predetermined depth and parallel to the axial direction of the ceramic shaft 40. The power-source-side hole portion 52b is a portion of the second redirecting hole 52 that is located near the power source (near the installation table 60). The power-source-side hole portion 52b extends from the position defined on the lower surface of the redirecting member 50 and coinciding with the second fitting hole 62 to a predetermined depth and parallel to the axial direction of the ceramic shaft 40. The depth of the plate-side hole portion 52a and the depth of the power-source-side hole portion 52b may be the same or different. The oblique hole portion 52c extends between the bottom of the plate-side hole portion 52a and the bottom of the power-source-side hole portion 52b and obliquely connects the plate-side hole portion 52a and the power-source-side hole portion 52b to each other.

The RF redirecting hole 53 includes a plate-side hole portion 53a, a power-source-side hole portion 53b, and an oblique hole portion 53c. The plate-side hole portion 53a is a portion of the RF redirecting hole 53 that is located near the ceramic plate 20. The plate-side hole portion 53a extends from the position defined on the upper surface of the redirecting member 50 and coinciding with the RF terminal hole 27a to a predetermined depth and parallel to the axial direction of the ceramic shaft 40. The power-source-side hole portion 53b is a portion of the RF redirecting hole 53 that is located near the power source (near the installation table 60). The power-source-side hole portion 53b extends from the position defined on the lower surface of the redirecting member 50 and coinciding with the RF fitting hole 63 to a predetermined depth and parallel to the axial direction of the ceramic shaft 40. The depth of the plate-side hole portion 53a and the depth of the power-source-side hole portion 53b may be the same or different. The oblique hole portion 53c extends between the bottom of the plate-side hole portion 53a and the bottom of the power-source-side hole portion 53b and obliquely connects the plate-side hole portion 53a and the power-source-side hole portion 53b to each other.

Figure 7:
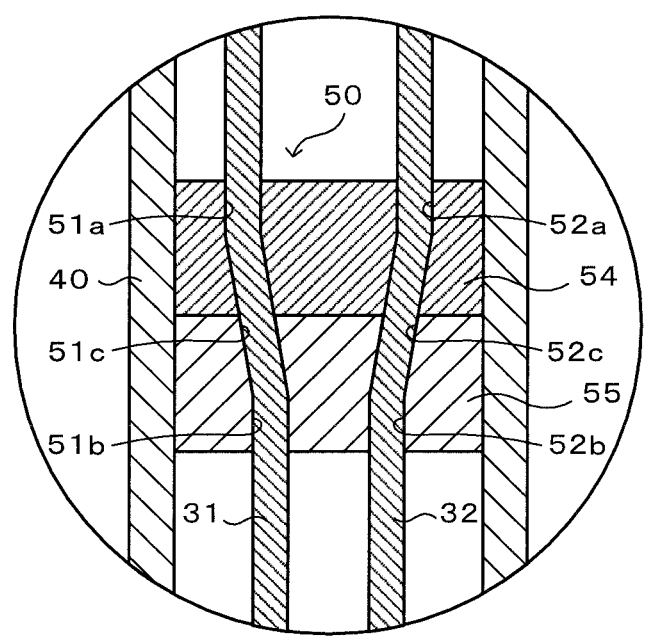
FIG. 7 is a longitudinal sectional view of components 54 and 55 included in the redirecting member 50.

As illustrated in FIG. 7, the redirecting member 50 may be a stack of two components 54 and 55 separated by a plane extending parallel to the wafer placement surface 20a and across the oblique hole portions 51c to 53c. A redirecting member 50 formed of a single component is difficult to manufacture in making the oblique hole portions 51c to 53c. The redirecting member 50 formed of the two separate components 54 and 55 as illustrated in FIG. 7 is relatively easy to manufacture. The components 54 and 55 may be bonded to each other, coupled to each other, or simply in contact with each other, instead of being bonded or coupled to each other.

The first power-supplying member 31 extending from the first fitting hole 61 provided on the power-source side passes through the power-source-side hole portion 51b, the oblique hole portion 51c, and the plate-side hole portion 51a of the first redirecting hole 51 in the redirecting member 50 and reaches the first terminal hole 23a. Therefore, the first power-supplying member 31 is forcibly bent at the boundary between the power-source-side hole portion 51b and the oblique hole portion 51c and at the boundary between the oblique hole portion 51c and the plate-side hole portion 51a. The force generated by the bending is applied to the redirecting member 50. This also applies to the cases of the second power-supplying members 32 and the RF power-supplying member 33. The power-supplying members 31 to 33 extending from the respective fitting holes 61 to 63 provided in the installation table 60 and arranged relatively close to one another are bent at the redirecting member 50 and eventually reach the respective terminal holes 23a, 24a, and 27a provided in the ceramic plate 20 and arranged relatively far from one another. Therefore, the forces generated by the bending are not (or hardly) applied to the joints between the first terminals 23 and the first power-supplying members 31, the joints between the second terminals 24 and the second power-supplying members 32, and the joint between the RF terminal 27 and the RF power-supplying member 33.

The redirecting member 50 has other holes (not illustrated) including holes through which gas tubes for supplying gas to the gas holes are allowed to pass, and holes through which thermocouples are allowed to pass.

Now, a usage of the ceramic heater 10 will be described. First, the ceramic heater 10 is installed on the installation table 60 provided in a vacuum chamber (not illustrated), and a shower head (not illustrated) is positioned above the wafer placement surface 20a with a space provided in between. Furthermore, a wafer W is placed on the wafer placement surface 20a. Subsequently, the power to be supplied to the first heater electrode 21 is adjusted by the first power source (not illustrated) such that the temperature of the first zone Z1 that is detected by an inner-peripheral-side thermocouple (not illustrated) becomes a predetermined inner-peripheral-side target temperature. Simultaneously, the power to be supplied to the second heater electrode 22 is adjusted by the second power source (not illustrated) such that the temperature of the second zone Z2 that is detected by an outer-peripheral-side thermocouple (not illustrated) becomes a predetermined outer-peripheral-side target temperature. Thus, the wafer W is controlled to have a desired temperature. Subsequently, the atmosphere in the vacuum chamber is set to a vacuum atmosphere or a decompressed atmosphere. Furthermore, RF power is supplied from the RF power source to the RF electrode 26. Thus, plasma is generated between parallel flat electrodes, which are the shower head and the RF electrode 26. The plasma thus generated is used in performing CVD or etching on the wafer W.

Now, the correspondence between (some of) the elements according to the present embodiment and (some of) the elements according to the present invention will be described. The first heater electrode 21, the second heater electrode 22, and the RF electrode 26 according to the present embodiment each correspond to the electrode according to the present invention. The first power-supplying members 31, the second power-supplying members 32 and the RF power-supplying member 33 each correspond to the power-supplying member. The first terminal holes 23a, the second terminal holes 24a, and the RF terminal hole 27a each correspond to the plate-side attaching site. The first fitting holes 61, the second fitting holes 62, and the RF fitting hole 63 each correspond to the power-source-side attaching site.

In the ceramic heater 10 according to the present embodiment described above, as illustrated in plan view in FIG. 5, each of the fitting holes and a corresponding one of the terminal holes (the first fitting holes 61 and the first terminal holes 23a, the second fitting holes 62 and the second terminal holes 24a, and the RF fitting hole 63 and the RF terminal hole 27a) are shifted from each other. In the present embodiment, the first fitting holes 61, the second fitting holes 62, and the RF fitting hole 63 are arranged closer to one another than the first terminal holes 23a, the second terminal holes 24a, and the RF terminal hole 27a. Furthermore, the redirecting member 50 is provided inside the ceramic shaft 40. In the redirecting member 50, the first power-supplying members 31 extending from the first fitting holes 61 are held in such a manner as to be forcibly redirected toward the first terminal holes 23a, the second power-supplying members 32 extending from the second fitting holes 62 are held in such a manner as to be forcibly redirected toward the second terminal holes 24a, and the RF power-supplying member 33 extending from the RF fitting hole 63 is held in such a manner as to be forcibly redirected toward the RF terminal hole 27a. The redirecting member 50 reduces loads (moments) applied to the power-supplying members 31 to 33 and acting to disconnect the power-supplying members 31 to 33 from the terminals 23, 24, and 27. Therefore, the disconnection of the power-supplying members 31 to 33 from the terminals 23, 24, and 27 can be prevented.

The redirecting member 50 has the first redirecting holes 51, the second redirecting holes 52, and the RF redirecting hole 53. Therefore, the redirecting member 50 firmly holds the power-supplying members 31 to 33 such that the power-supplying members 31 to 33 extending from the respective fitting holes 61 to 63 provided on the power-source side are forcibly redirected toward the respective terminal holes 23a, 24a, and 27a provided on the plate side. The redirecting member 50 may be the stack of two components 54 and 55 as illustrated in FIG. 7. The redirecting member 50 having such a configuration is relatively easy to manufacture.

The first power-supplying members 31 each include the flange 31d near the ceramic plate 20. The flange 31d is used in pushing the first power-supplying member 31 toward the first terminal 23 when the first power-supplying member 31 is pressure-bonded or thermally pressure-bonded to the first terminal 23 provided in the first terminal hole 23a. The flange 31d has a diameter greater than the diameter of the cable 31f of the first power-supplying member 31. Other power-supplying members 32 and 33 have the same flanges as those of the first power-supplying members 31. The flanges of adjacent ones of the power-supplying members 31 to 33 need to be insulated from each other. Furthermore, the occurrence of creeping discharge between adjacent ones of the terminal holes needs to be prevented. Therefore, the first terminal holes 23a, the second terminal holes 24a, and the RF terminal hole 27a provided in the ceramic plate 20 need to be arranged farther from one another than the first fitting holes 61, the second fitting holes 62, and the RF fitting hole 63 provided in the installation table 60. Accordingly, the terminal holes tend to be shifted from the respective fitting holes in plan view. Such a configuration is suitable for the application of the present invention.

Even in a case where power-supplying members including no flanges are employed, it is preferable that the first terminal holes 23a, the second terminal holes 24a, and the RF terminal hole 27a provided in the ceramic plate 20 be arranged farther from one another than the first fitting holes 61, the second fitting holes 62, and the RF fitting hole 63 provided in the installation table 60. This is because an area in the ceramic shaft 40 that is near the ceramic plate 20 is more likely to have a high temperature and to cause aerial discharge than an area in the ceramic shaft 40 that is near the installation table 60.

The first power-supplying members 31, the second power-supplying members 32, and the RF power-supplying member 33 are respectively soldered to the first terminals 23, the second terminals 24, and the RF terminal 27. Soldered joints are more likely to be broken when receiving a load than mechanical joints using screws or the like, and are therefore suitable for the application of the present invention.

The present invention is not limited to the above-described embodiment and may be, of course, implemented in various modes within the technical scope of the present invention.

Figure 8:
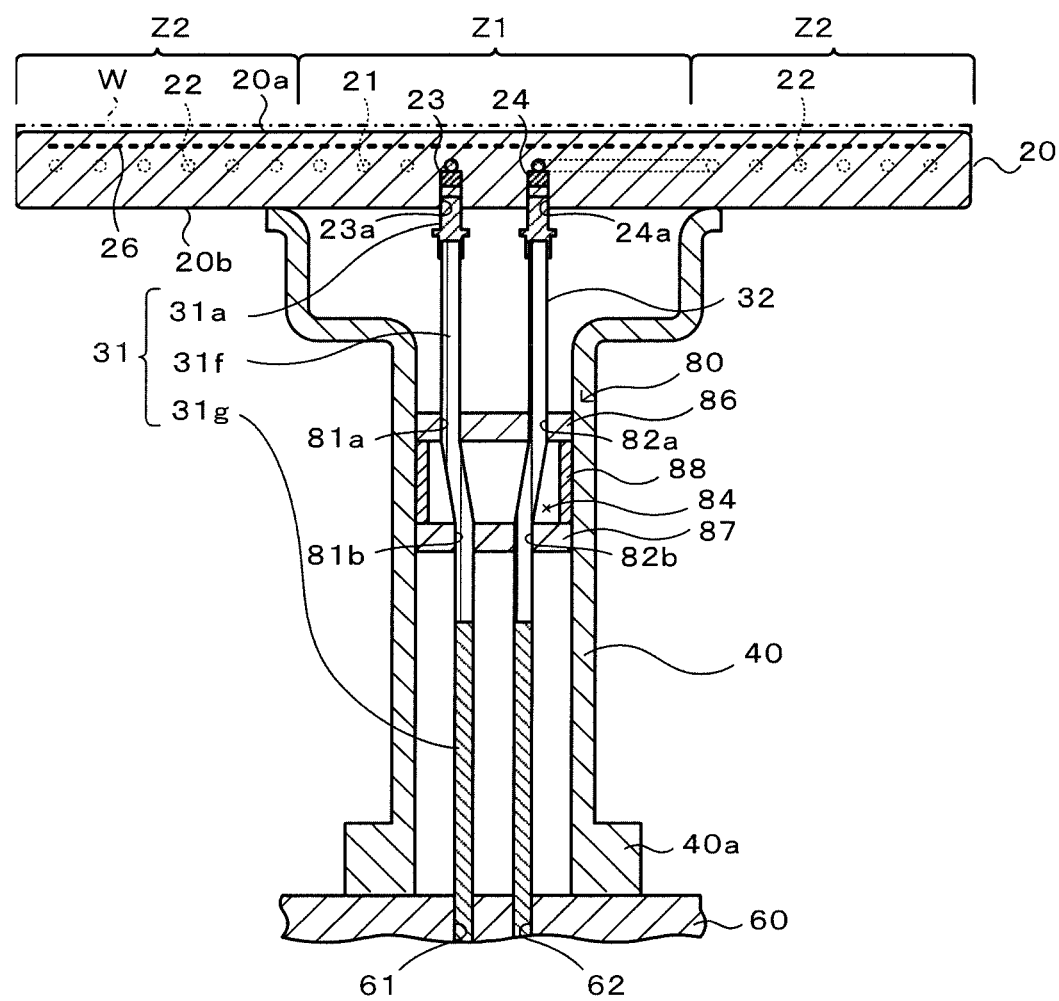
FIG. 8 is a longitudinal sectional view of a redirecting member 80.
Figure 9:
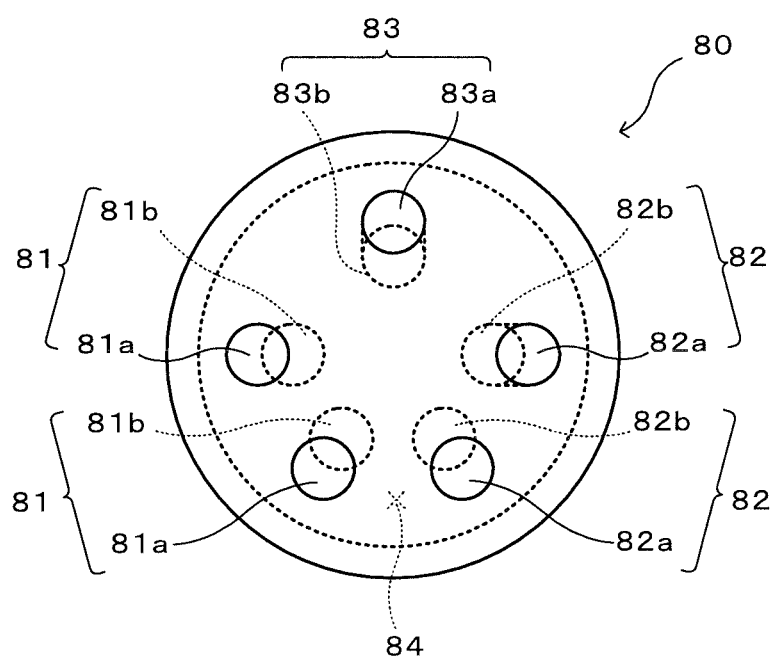
FIG. 9 is a plan view of the redirecting member 80.

For example, the redirecting member 50 employed in the above embodiment may be replaced with a redirecting member 80 illustrated in FIGS. 8 and 9. In FIG. 8, elements that are the same as those described in the above embodiment are denoted by corresponding ones of the reference signs used therein. As illustrated in FIG. 9, the redirecting member 80 has first redirecting holes 81, second redirecting holes 82 and an RF redirecting hole 83.

In the above embodiment, the redirecting member 50 may be either the stack of two components 54 and 55 as illustrated in FIG. 7 or a stack of three components. Specifically, the redirecting member 50 may be a stack of three components separated by a plane extending parallel to the wafer placement surface 20a and passing through the boundary between the plate-side hole portions 51a to 53a and the oblique hole portions 51c to 53c and by a plane extending parallel to the wafer placement surface 20a and passing through the boundary between the oblique hole portions 51c to 53c and the power-source-side hole portions 51b to 53b. The redirecting member 50 having such a configuration is also relatively easy to manufacture.

Figure 10:
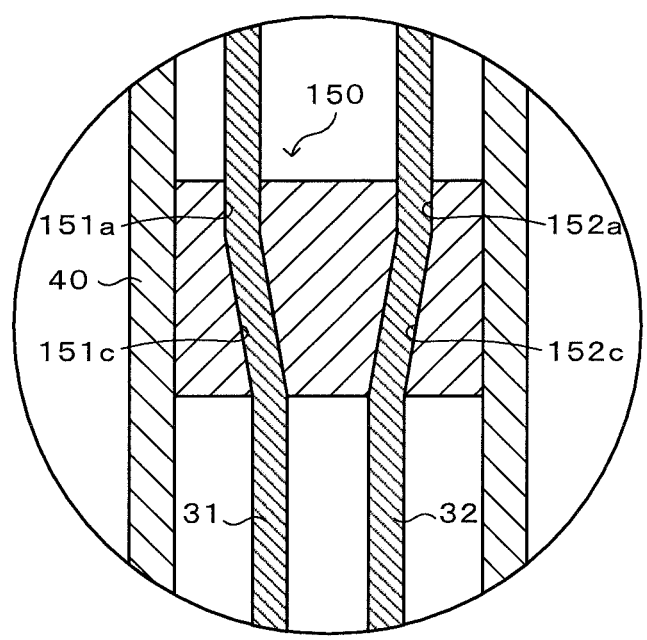
FIG. 10 is a longitudinal sectional view of a redirecting member 150.

In the above embodiment, the redirecting member 50 has the plate-side hole portions 51a to 53a, the power-source-side hole portions 51b to 53b, and the oblique hole portions 51c to 53c. Alternatively, a redirecting member 150 illustrated in FIG. 10 may be employed. In FIG. 10, elements that are the same as those described in the above embodiment are denoted by corresponding ones of the reference signs used therein. The redirecting member 150 has plate-side hole portions 151a and 152a and oblique hole portions 151c and 152c but has no power-source-side hole portions. In such a configuration as well, the first and second power-supplying members 31 and 32 can be forcibly redirected. The redirecting member 150 further has a plate-side hole portion and an oblique hole portion (not illustrated in FIG. 10) for holding the RF power-supplying member 33.

In the above embodiment, the centers of the two first terminal holes 23a, the centers of the two second terminal holes 24a, and the center of the one RF terminal hole 27a are positioned on the circumference C1 of the circle having the diameter D1. Meanwhile, the centers of the two first fitting holes 61, the centers of the two second fitting holes 62, and the center of the one RF fitting hole 63 are positioned on the circumference C2 of the circle having the diameter D2 (<D1). The present invention is not limited to such a case. As long as each of the terminal holes and a corresponding one of the fitting holes are shifted from each other in plan view, the centers of all terminal holes do not necessarily need to be positioned on the circumference of a common circle. Furthermore, the centers of all fitting holes do not necessarily need to be positioned on the circumference of a common circle. Alternatively, while the pair of each of the first terminal holes 23a, which receive the first power-supplying members 31, and a corresponding one of the first fitting holes 61 are shifted from each other in plan view, the pair of each of the second terminal holes 23b and a corresponding one of the second fitting holes 62 and the pair of the RF terminal hole 27a and the RF fitting hole 63 do not necessarily need to be shifted from each other in plan view. In such a case, the first power-supplying members 31 are redirected by the redirecting member 50, whereas the second and RF power-supplying members 32 and 33 vertically extend through the redirecting member 50.

While the above embodiment employs the redirecting member 50 made of ceramic, the redirecting member 50 does not necessarily need to be made of ceramic. For example, if the service temperature is low, the redirecting member 50 may be made of a resin that is resistant to that service temperature.

In the above embodiment, the ceramic plate 20 may include an electrostatic electrode embedded therein. In such a case, when a voltage is applied to the electrostatic electrode after a wafer W is placed on the wafer placement surface 20a, the wafer W can be electrostatically attracted to the wafer placement surface 20a. The electrostatic electrode is provided with a power-supplying member. The power-supplying member, which extends from a power-source-side fitting hole (a hole having the center positioned on the circumference C2 illustrated in FIG. 5), is also held by the redirecting member in such a manner as to be forcibly redirected toward a terminal hole provided in the ceramic plate 20 (a hole having the center positioned on the circumference C1 illustrated in FIG. 5).

In the above embodiment, the RF electrode 26 is connected to the RF power source. Alternatively, while the RF electrode 26 is grounded, the shower head (not illustrated) may be connected to the RF power source. Moreover, in the above embodiment, the RF electrode 26 may be omitted.

In the above embodiment, the first and second zones Z1 and Z2 are each a single solid zone. Alternatively, at least one of the first and second zones Z1 and Z2 may be sectioned into a plurality of small zones. In such a case, the resistance heating element (heater electrode) is provided in each of the small zones and independently of one another, with power-supplying members attached to two respective ends of the resistance heating element. Such power-supplying members extend from respective power-source-side fitting holes (holes having the centers positioned on the circumference C2 illustrated in FIG. 5) and are held by the redirecting member in such a manner as to be forcibly redirected toward respective terminal holes provided in the ceramic plate 20 (holes having the centers positioned on the circumference C1 illustrated in FIG. 5).

The application claims the benefit of Japanese Patent Application No. 2020-174775 filed Oct. 16, 2020, which is hereby incorporated by reference herein in its entirety.

What is claimed is:

1. A wafer placement table comprising:
   a ceramic plate having a wafer placement surface;
   an electrode embedded in the ceramic plate;
   a hollow ceramic shaft attached to a surface of the ceramic plate, the surface being opposite the wafer placement surface;
   a power-supplying member running inside the ceramic shaft and connected to a terminal of the electrode, the power-supplying member conveying power from a power source to the electrode;
   a plate-side attaching site defined on the ceramic plate and to which the power-supplying member is attached, the plate-side attaching site being defined in an area enclosed by the ceramic shaft and in correspondence with the terminal of the electrode;
   a power-source-side attaching site defined at a free end of the ceramic shaft and to which the power-supplying member is attached, the power-source-side attaching site being defined in correspondence with the plate-side attaching site and in such a manner as to be shifted from the plate-side attaching site in plan view; and
   a redirecting member including at least one component provided inside the ceramic shaft and spanning an entire inside diameter of the ceramic shaft and fixed between a top ceramic plate end of the ceramic shaft and a bottom free end of the ceramic shaft and with the ceramic shaft extending both above and below the redirecting member and that holds the power-supplying member such that the power-supplying member extending from the power-source-side attaching site is forcibly redirected toward the plate-side attaching site through at least one redirecting hole running through the redirecting member, and
   wherein the at least one component of the redirecting member comprises:
      a plate-side hole portion located below and not in contact with the ceramic plate and extending from a position coinciding with the plate-side attaching site and parallel to an axial direction of the ceramic shaft; and
      an oblique hole portion extending obliquely through at least a portion of the at least one redirecting hole in the redirecting member from the plate-side hole portion to a position coinciding with the power-source-side attaching site, and
   wherein the oblique hole portion is closer to the power source than the plate side hole portion.

2. The wafer placement table according to claim 1,
   wherein the electrode is one of a plurality of electrodes including a heater electrode,
   the power-supplying member is one of a plurality of power-supplying members respectively connected to the terminals of the plurality of electrodes,
   the plate-side attaching site is one of a plurality of plate-side attaching sites defined in the area and in correspondence with the terminals of the plurality of electrodes,
   the power-source side attaching site is one of a plurality of power-source side attaching sites defined in correspondence with the plurality of plate-side attaching sites, with at least one of the plurality of power-source side attaching sites being shifted from a corresponding one of the plate-side attaching sites in plan view, and
   one of the plurality of power-supplying members that extends between the power-source-side attaching site and the plate-side attaching site that are shifted from each other is forcibly redirected by the redirecting member from a position coinciding with the power-source-side attaching site to a position coinciding with the plate-side attaching site.

3. The wafer placement table according to claim 2,
   wherein the plurality of power-source-side attaching sites are all shifted from the respective plate-side attaching sites in plan view.

4. The wafer placement table according to claim 2,
   wherein the power-supplying members each include a flange near the ceramic plate.

5. The wafer placement table according to claim 1,
   wherein the at least one component of the redirecting member further comprises:
      a power-source-side hole portion located above and not in contact with the power source and extending from a position coinciding with the power-source-side attaching site and parallel to the axial direction of the ceramic shaft, and
   wherein the oblique hole portion extends through at least a portion of the at least one redirecting hole in the redirecting member between the plate-side hole portion and the power-source-side hole portion and obliquely connects the plate-side hole portion and the power-source-side hole portion.

6. The wafer placement table according to claim 5,
   wherein the redirecting member includes two components separated by a plane extending parallel to the wafer placement surface and across the oblique hole portion.

7. The wafer placement table according to claim 1,
   wherein the power-supplying member is soldered to the terminal of the electrode.

8. The wafer placement table according to claim 1,
   wherein the redirecting member is made of ceramic.

9. A wafer placement table comprising:
   a ceramic plate having a wafer placement surface;
   an electrode embedded in the ceramic plate;

a hollow ceramic shaft attached to a surface of the ceramic plate, the surface being opposite the wafer placement surface;

a power-supplying member running inside the ceramic shaft and connected to a terminal of the electrode, the power-supplying member conveying power from a power source to the electrode;

a plate-side attaching site defined on the ceramic plate and to which the power-supplying member is attached, the plate-side attaching site being defined in an area enclosed by the ceramic shaft and in correspondence with the terminal of the electrode;

a power-source-side attaching site defined at a free end of the ceramic shaft and to which the power-supplying member is attached, the power-source-side attaching site being defined in correspondence with the plate-side attaching site and in such a manner as to be shifted from the plate-side attaching site in plan view; and a redirecting member including at least one component provided inside the ceramic shaft and spanning an entire inside diameter of the ceramic shaft and fixed between a top ceramic plate end of the ceramic shaft and a bottom free end of the ceramic shaft and with the ceramic shaft extending both above and below the redirecting member and that holds the power-supplying member such that the power-supplying member extending from the power-source-side attaching site is forcibly redirected toward the plate-side attaching site through a space between a plate-side hole portion and a power-source-side hole portion of the redirecting member, wherein the at least one component of the redirecting member comprises:
  the plate-side hole portion located below and not in contact with the ceramic plate and extending from a position coinciding with the plate-side attaching site and parallel to an axial direction of the ceramic shaft;
  the power-source-side hole portion located above and not in contact with the power source and extending from a position coinciding with the power-source-side attaching site and parallel to the axial direction of the ceramic shaft; and
  a space defined between the plate-side hole portion and the power-source-side hole portion.

10. The wafer placement table according to claim 9,
wherein the redirecting member includes a first component having the plate-side hole portion, a second component having the power-source-side hole portion, and a third component defining the space, and
wherein both the first component and second components are in contact with the third component, and
wherein the third component is located between the first component and the second component.

11. The wafer placement table according to claim 9,
wherein the redirecting member is made of ceramic.

* * * * *